(12) United States Patent
Kao

(10) Patent No.: US 10,158,360 B2
(45) Date of Patent: *Dec. 18, 2018

(54) CAPACITIVE SWITCH HAVING HIGH ACCURACY

(71) Applicant: PixArt Imaging Inc., Hsin-Chu County (TW)

(72) Inventor: Hong-Sing Kao, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/703,927

(22) Filed: Sep. 13, 2017

(65) Prior Publication Data

US 2018/0006647 A1     Jan. 4, 2018

Related U.S. Application Data

(63) Continuation of application No. 14/878,313, filed on Oct. 8, 2015, now Pat. No. 9,838,007.

(30) Foreign Application Priority Data

Dec. 10, 2014  (TW) .............................. 103143263 A

(51) Int. Cl.
*H03K 17/96*     (2006.01)

(52) U.S. Cl.
CPC ....... *H03K 17/962* (2013.01); *H03K 2217/960745* (2013.01)

(58) Field of Classification Search
None
See application file for complete search history.

(56) References Cited

U.S. PATENT DOCUMENTS 5,554,973 A      9/1996  Kawashima et al.
2014/0312962 A1*  10/2014  Kao .................. H03K 17/9622
                                                                          327/517

FOREIGN PATENT DOCUMENTS

TW        201327335 A       7/2013

* cited by examiner

*Primary Examiner* — Melissa Koval
*Assistant Examiner* — Nasima Monsur
(74) *Attorney, Agent, or Firm* — Hauptman Ham, LLP

(57) ABSTRACT

A capacitive switch includes a drive circuit, a detection circuit, a reference circuit and an identification unit. The drive circuit outputs a drive signal and a switching signal, wherein the drive signal is outputted to a first node and a second node. The detection circuit is sequentially coupled to the first node and the second node according to the switching signal and generates a first detection signal according to the drive signal. The reference circuit is sequentially coupled to the second node and the first node according to the switching signal and generates a second detection signal according to the drive signal. The identification unit includes a first input terminal and a second input terminal respectively coupled to the first node and the second node, and identifies a phase shift between inputted detection signals received by the first input terminal and the second input terminal.

20 Claims, 10 Drawing Sheets

CAPACITIVE SWITCH HAVING HIGH ACCURACY

CROSS REFERENCE TO RELATED APPLICATION

This application is a continuation application of U.S. application Ser. No. 14/878,313, filed on Oct. 8, 2015 and claims the priority benefit of Taiwan Patent Application Serial Number 103143263, filed on Dec. 10, 2014, the full disclosure of which is incorporated herein by reference.

BACKGROUND

1. Field of the Disclosure

This disclosure generally relates to a switching device and, more particularly, to a capacitive switch employing a reference circuit to improve the detection accuracy.

2. Description of the Related Art

Conventionally, the switch device uses a mechanical switch to detect the pressing of a user or the on/off status. However, the conventional mechanical switch may appear slow reaction due to poor electrical contact or failure due to the fatigue of elastic element after frequent operation.

Therefore, the industry proposed the capacitive switch that can detect the capacitance variation caused by a touch, e.g. detecting a change of oscillation frequency or charging duration, to accordingly identify whether a touch event occurs or not. However, the electrical offset may be generated in the conventional capacitive detection circuit due to the variation of the manufacturing process, operating voltage and temperature such that misidentification may occur during operation thereby decreasing the operation accuracy.

Accordingly, the present disclosure further provides a capacitive switch whose detection results are compared with the output of a reference circuit so as to eliminate the electrical offset caused by factors of the manufacturing process and operating environment thereby achieving higher detection accuracy.

SUMMARY

The present disclosure provides a capacitive switch that can eliminate the electrical offset caused by the manufacturing process, operating voltage and temperature thereby improving the detection accuracy.

The present disclosure provides a capacitive switch that can improve the circuit performance and reduce the complexity of the digital signal processing and firmware.

The present disclosure provides a capacitive switch including a drive circuit, a capacitive detection circuit, a capacitive reference circuit and an identification unit. The drive circuit is configured to output a drive signal to a first circuit path and a second circuit path. The capacitive detection circuit is configured to be coupled to the first circuit path at a first time to generate a first detection signal, and coupled to the second circuit path at a second time to generate a second detection signal. The capacitive reference circuit is configured to be coupled to the second circuit path at the first time to generate a third detection signal, and coupled to the first circuit path at the second time to generate a fourth detection signal. The identification unit is electrically connected to the first circuit path and the second circuit path, and configured to identify a first phase shift between the first detection signal and the third detection signal, identify a second phase shift between the second detection signal and the fourth detection signal, and calculate a difference value between the first phase shift and the second phase shift.

The present disclosure further provides a capacitive switch including a drive circuit, a capacitive detection circuit, a capacitive reference circuit and an identification unit. The drive circuit is configured to output a drive signal to a first circuit path and a second circuit path. The capacitive detection circuit is electrically connected to the first circuit path. The capacitive reference circuit is electrically connected to the second circuit path. The identification unit has a first input terminal and a second input terminal. The first input terminal is coupled to the first circuit path at a first time to receive a first detection signal generated by the capacitive detection circuit and coupled to the second circuit path at a second time to receive a second detection signal generated by the capacitive reference circuit. The second input terminal is coupled to the second circuit path at the first time to receive a third detection signal generated by the capacitive reference circuit and coupled to the first circuit path at the second time to receive a fourth detection signal generated by the capacitive detection circuit. The identification unit is configured to identify a first phase shift between the first detection signal and the third detection signal, and identify a second phase shift between the second detection signal and the fourth detection signal.

The present disclosure further provides a capacitive switch including a drive circuit, a multiplexer, a plurality of capacitive detection circuits, a capacitive reference circuit and an identification unit. The drive circuit is configured to output a drive signal to a first circuit path and a second circuit path. One of the plurality of capacitive detection circuits is configured to be coupled to the first circuit path via the multiplexer at a first time to generate a first detection signal, and coupled to the second circuit path via the multiplexer at a second time to generate a second detection signal. The capacitive reference circuit is configured to be coupled to the second circuit path at the first time to generate a third detection signal, and coupled to the first circuit path at the second time to generate a fourth detection signal. The identification unit is electrically connected to the first circuit path and the second circuit path, and configured to identify a first phase shift between the first detection signal and the third detection signal and identify a second phase shift between the second detection signal and the fourth detection signal.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The present disclosure is related to a capacitive switch configured to detect the capacitance variation induced by the touch of an object (e.g. human body) and correspondingly output a control signal for controlling operating parameters of an electronic device, e.g., including on/off, output, directivity and so on, wherein the electronic device may be home appliances or portable electronic products capable of being controlled by a switch device without particular limitations. The capacitive switch of the present disclosure includes at least one detection circuit and a reference circuit that are replicas of each other, wherein output results of the reference circuit are for being compared with detection results of the detection circuit so as to eliminate the electrical offset caused by manufacturing processes and environmental factors thereby improving the detection accuracy. In the descriptions of the present disclosure, the term "replica" is referred to circuits having identical characteristics (e.g. having identical loading) and preferably manufactured by the same process.

Figure 1:
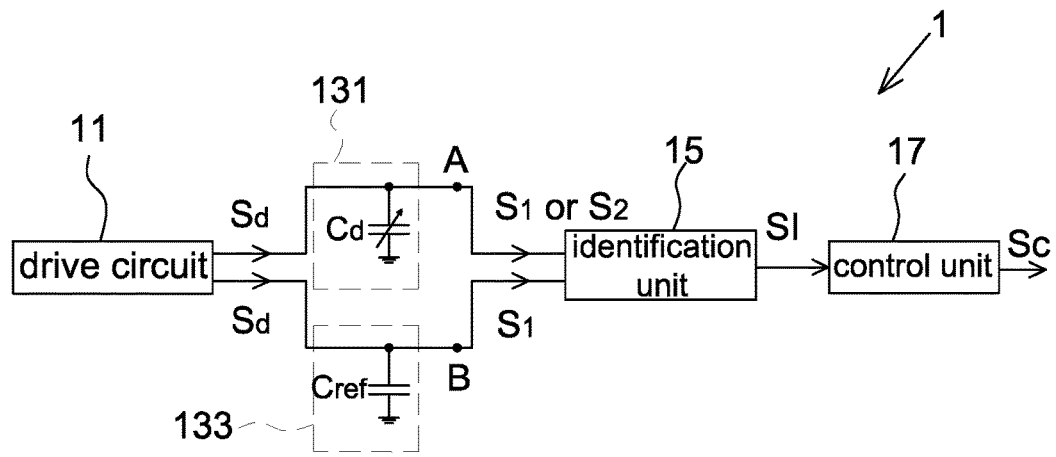
FIG. 1 is a schematic block diagram of a capacitive switch according to a first embodiment of the present disclosure.

Referring to FIG. 1, it shows a schematic block diagram of the capacitive switch 1 according to a first embodiment of the present disclosure, which includes a drive circuit 11, a detection circuit 131, a reference circuit 133 and an identification unit 15, wherein the reference circuit 133 is a replica of the detection circuit 131.

The drive circuit 11 includes an oscillator or a signal generating circuit configured to periodically output a drive signal Sd, wherein the drive signal Sd may be a square wave, sinusoidal wave, trapezoid wave or triangle wave without particular limitation as long as the drive signal Sd contains the identifiable high voltage level H and low voltage level L. In addition, the drive circuit 11 may output the drive signal Sd with non-fixed period. In this embodiment, the drive circuit 11 simultaneously inputs drive signals Sd having identical characteristics, e.g., identical intensity, waveforms and phases, into the detection circuit 131 and the reference circuit 133. For example, the detection circuit 131 and the reference circuit 133 simultaneously receive one drive signal Sd, or the drive circuit 11 generates two identical drive signals Sd to be provided to the detection circuit 131 and the reference circuit 133 respectively. In other embodiments, the drive circuit 11 provides two drive signals having an identical waveform but having a predetermined phase shift therebetween to the detection circuit 131 and the reference circuit 133 respectively.

The detection circuit 131 includes a detection capacitor Cd. The drive signal Sd is configured to charge the detection capacitor Cd so as to generate a first signal S1 or a second signal S2, wherein the detection capacitor Cd may be formed by one capacitor or by connecting a plurality of capacitors. More specifically speaking, the detection circuit 131 detects a touch according to a capacitance variation of the detection capacitor Cd. The detection circuit 131 outputs the first signal S1 according to the drive signal Sd when the touch is not detected whereas outputs the second signal S2 according to the drive signal Sd when the touch is detected, wherein the first signal S1 and the second signal S2 are generated by the drive signal Sd charging the detection capacitor Cd. When a touch occurs, the capacitance of the detection capacitor Cd is changed to accordingly change the charging curve of the detection capacitor Cd and cause the phase delay; i.e. the second signal S2 delays the first signal S1 by a phase shift, wherein a value of the phase shift caused by the touch is determined according to circuit parameters.

The reference circuit 133 includes a reference capacitor Cref, which may or may not have the same capacitance value as the detection capacitor Cd. In the embodiment of the present disclosure, the reference capacitor Cref has the same capacitance value as the detection capacitor Cd. In the present disclosure, as the reference circuit 133 is not used to detect a touch event, when the drive signal Sd charges the reference capacitor Cref, only the first signal S1 is generated but the second signal S2 is not generated. More specifically speaking, the reference circuit 133 outputs the first signal S1, which is identical to the first signal S1 outputted by the detection circuit 131, according to the charging of the drive signal Sd to the reference capacitor Cref. As the reference circuit 133 is for being compared with the detection circuit 131, the present disclosure detects a touch according to the capacitance variation of the detection circuit 131 and the reference circuit 133 is embedded inside the chip.

The identification unit 15 is coupled to the detection circuit 131 and the reference circuit 133 and configured to output an identified signal SI (described exemplarily below) according to a phase shift between the second signal S2 of the detection circuit 131 and the first signal S1 of the reference circuit 133.

Figure 2A:
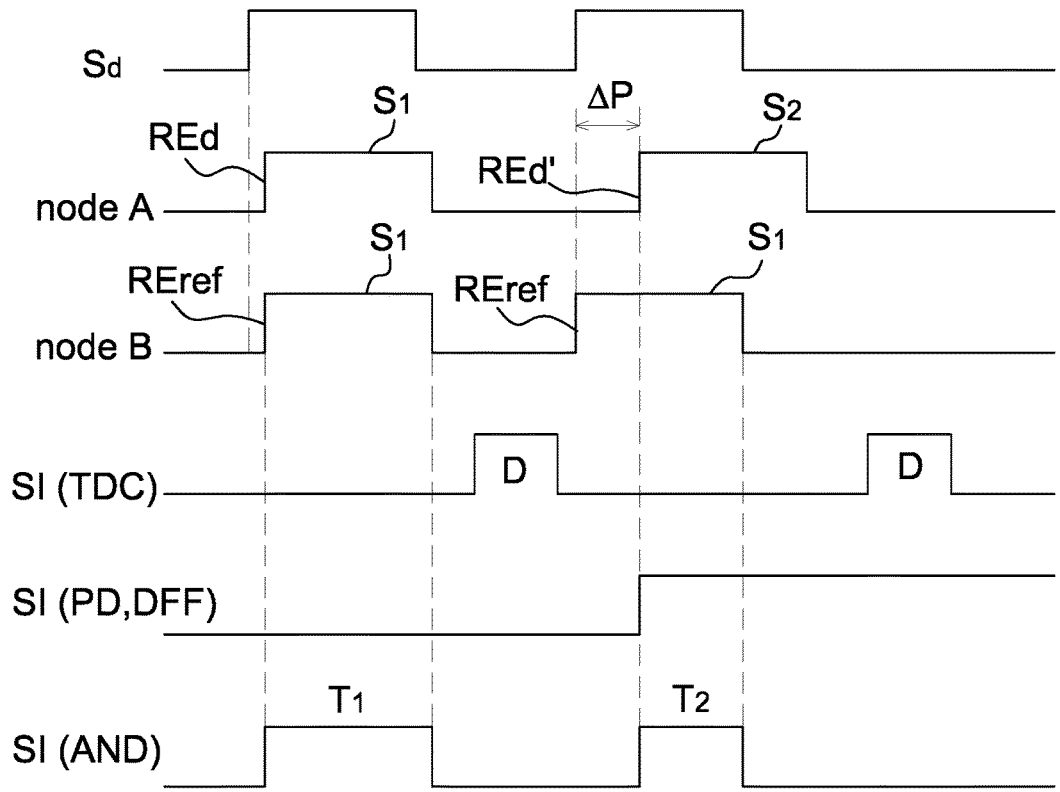
FIGS. 2A-2C are operational schematic diagrams of the capacitive switch of FIG. 1.

FIG. 2A is an operational schematic diagram of the capacitive switch of FIG. 1. Please referring to FIGS. 1 and 2A, the drive circuit 11 periodically outputs a drive signal Sd, wherein for illustration purpose, the drive signal Sd is shown as a square wave herein, but as mentioned above the drive signal Sd is not limited to the square wave. When a touch is not detected, the detection circuit 131 outputs a first signal S1 according to the drive signal Sd; whereas when the touch is detected, the detection circuit 131 outputs a second signal S2 according to the drive signal Sd, wherein the second signal S2 delays the first signal S1 by a phase shift $\Delta P$ (e.g. the signal shown at a node A). The reference circuit 131 outputs the first signal S1 (e.g. the signal shown at a node B) according to the drive signal Sd.

Figure 2B:
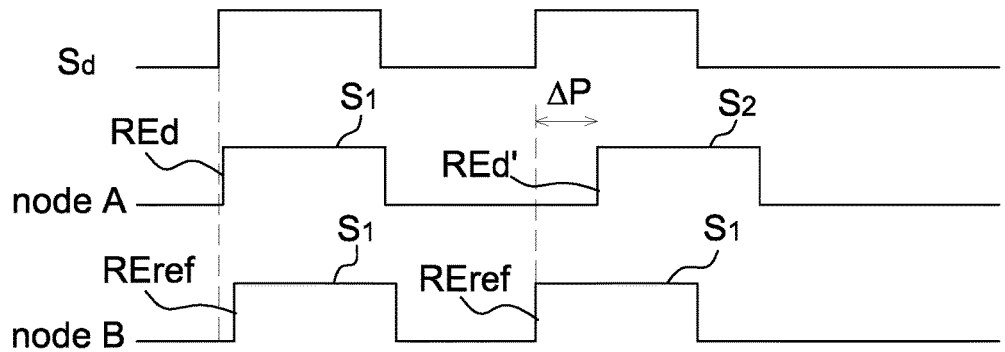
Figure 2C:
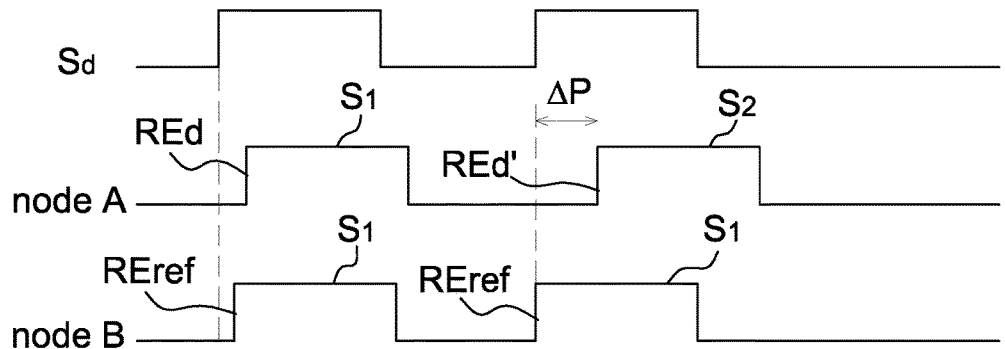

For example, the first signal S1 outputted by the detection circuit 131 has a detection signal rising edge REd and the second signal S2 outputted by the detection circuit 131 has a detection signal rising edge REd'. The first signal S1 outputted by the reference circuit 133 has a reference signal rising edge REref. In one embodiment, when the detection circuit 131 does not detect a touch, the detection signal rising edge REd and the reference signal rising edge REref do not have a phase shift; and when the detection circuit 131 detects the touch, the detection signal rising edge REd' and the reference signal rising edge REref have a phase shift ΔP therebetween. It should be mentioned that according to different drive signals Sd, the detection signal rising edge and the reference signal rising edge may be replaced by the detection signal falling edge and the reference signal falling edge respectively. More specifically speaking, in this embodiment the detection circuit 131 outputs a rising edge or a falling edge of the detection signal at different times according to the drive signal Sd and the capacitance variation (due to the touch), and the reference circuit 133 outputs a rising edge or a falling edge of the reference signal according to the drive signal Sd. The identification unit 15 then identifies a phase shift ΔP between the detection signal rising edge and the reference signal rising edge or between the detection signal falling edge and the reference signal falling edge so as to output an identified signal SI. In addition, referring to FIGS. 2B and 2C, when the detection circuit 131 does not detect a touch, the first signals S1 at the node A and the node B may have some phase shift. For example, FIG. 2B shows that the detection signal rising edge REd leads the reference signal rising edge REref by a small phase difference, whereas FIG. 2C shows that the detection signal rising edge REd lags the reference signal rising edge REref by a small phase difference. When the detection circuit 131 detects the touch, an obvious phase shift ΔP between the detection signal rising edge REd' and the reference signal rising edge REref is induced such that the identification unit 15 identifies the occurrence of a touch event accordingly.

The capacitive switch 1 of the present disclosure further includes a control unit 17 configured to output a control signal Sc according to the identified signal SI. For example, the control unit 17 outputs the control signal Sc to an electronic device according to a comparison result of comparing the phase shift ΔP with a threshold so as to perform the corresponding control, wherein the threshold is determined according to the required sensitivity.

In on embodiment, the drive circuit 11 and the control unit 17 are disposed separately but coupled electrically. In another embodiment, the drive circuit 11 is integrated in the control unit 17 such that the control unit 17 has the function of the drive circuit 11, e.g. outputting the drive signal Sd to charge the detection capacitor and the reference capacitor, and outputs the control signal Sc according to the identified signal SI.

The identification unit 15 outputs different identified signals SI according to different embodiments. In this embodiment, the identification unit 15 includes, for example, a time to digital converter (TDC), a phase detector (PD), a D flip-flop (DFF) or an AND gate configured to identify the phase shift ΔP.

Referring to FIG. 2A again, when the identification unit 15 includes the time to digital converter (TDC), the identification unit 15 outputs a digital data D containing information of the phase shift ΔP according to the phase shift ΔP to be served as the identified signal SI, and the digital data D has 2 bits, 4 bits and so on without particular limitations. If the identification unit 15 includes the phase detector (PD) or the D flip-flop (DFF) and when the identification unit 15 identifies the presence of the phase shift ΔP, a signal level is changed (e.g. from High to Low or from Low to High) to be served as the identified signal SI; whereas when the identification unit 15 identifies the absence of the phase shift ΔP, the signal level is maintained. When the identification unit 15 includes the AND gate, the identification unit 15 outputs signals having different signal durations, e.g. T1 and T2 shown in FIG. 2A, according to different phase shifts ΔP to be served as the identified signal SI. It should be mentioned that the timing sequence of every signal in FIG. 2A is not limited to that shown therein. FIG. 2A is only intended to illustrate that the identification unit 15 may output different identified signals SI according to different embodiments but not to limit the present disclosure.

Figure 3:
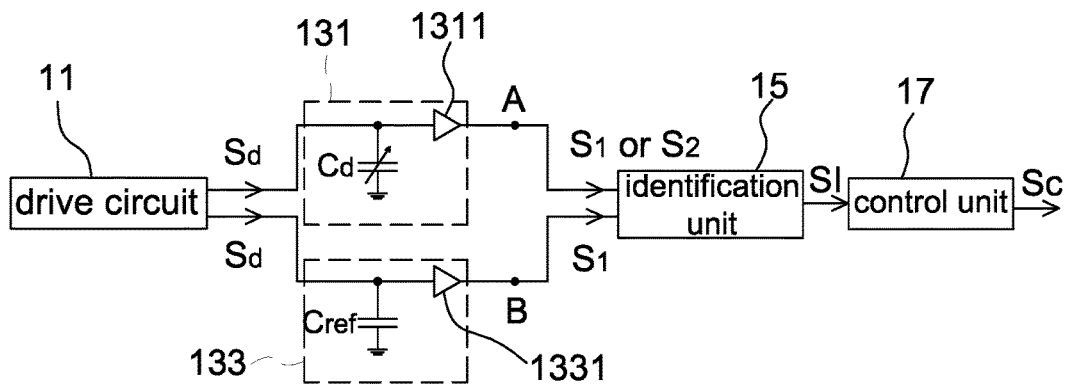
FIG. 3 is another schematic block diagram of a capacitive switch according to the first embodiment of the present disclosure, which includes a comparison unit.

Referring to FIG. 3, it is another schematic block diagram of the capacitive switch 1 according to the embodiment of the present disclosure. As mentioned above, as the drive signal Sd are not particular limited, the detection circuit 131 and the reference circuit 133 may respectively further include a comparison unit 1311 and 1331 configured to convert the first signal S1 and the second signal S2 to square signals (as shown in FIG. 2A) such that the phase shift ΔP between the rising/falling edge of the detection signal and the rising/falling edge of the reference signal is identified easily, wherein the comparison unit 1311 and 1331 respectively includes, for example, a slicer, an inverter or a buffer. In addition, operations of other elements are similar to those of FIG. 1 and thus details thereof are not described herein.

Figure 4:
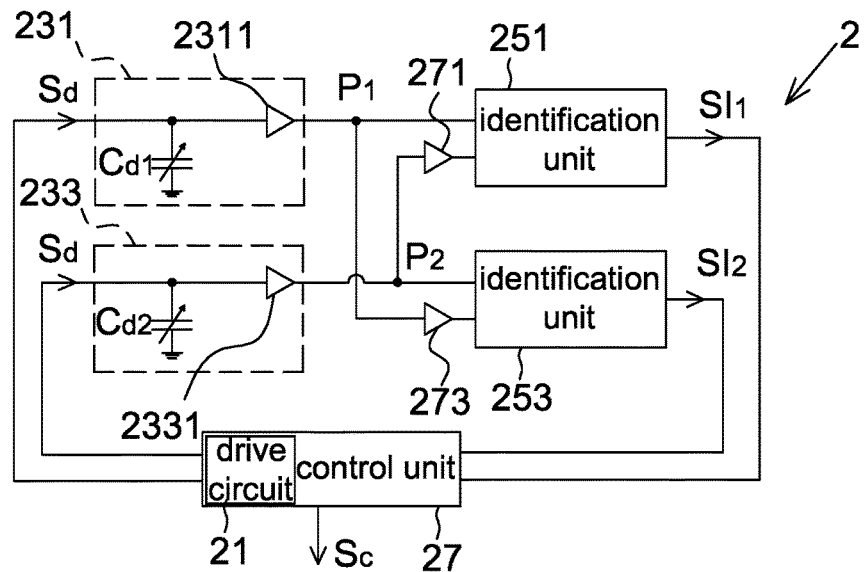
FIG. 4 is a schematic block diagram of a capacitive switch according to a second embodiment of the present disclosure.

Referring to FIG. 4, it is a schematic block diagram of the capacitive switch 2 according to a second embodiment of the present disclosure, which includes a first detection circuit 231, a second detection circuit 233, a first identification unit 251, a second identification unit 253 and a control unit 27, wherein the control unit 27 herein includes a drive circuit 21. In other embodiments the drive circuit 21 is not integrated in the control unit 27 (as shown in FIG. 1). In this embodiment, the first detection circuit 231 is shown to include a first detection capacitor Cd1 and a first comparison unit 2311; and the second detection circuit 233 is shown to include a second detection capacitor Cd2 and a second comparison unit 2331. As mentioned above the first comparison unit 2311 and the second comparison unit 2331 may not be implemented. The difference between the second embodiment and the first embodiment is that in the second embodiment the two detection capacitors Cd1 and Cd2 are both used to detect a touch. More specifically speaking, when an object touches the first detection circuit 231, the second detection circuit 233 is served as a reference circuit of the first detection circuit 231, and vise versa. Accordingly, in the second embodiment the first detection circuit 231 and the second detection circuit 233 are replicas of each other. As mentioned above, the identification units 251 and 253 respectively include, for example, a time to digital converter (TDC), a phase detector (PD), a D flip-flop (DFF) or an AND gate. In addition, the capacitive switch 2 may further include a first inverter 271 and a second inverter 273 coupled to one of input terminals of the identification units 251 and 253 to be served as a phase delay element such that electrical signals at the nodes P1 and P2 have a small phase difference to avoid identification error. It is appreciated that said phase delay element is not necessary the inverter.

Figure 5:
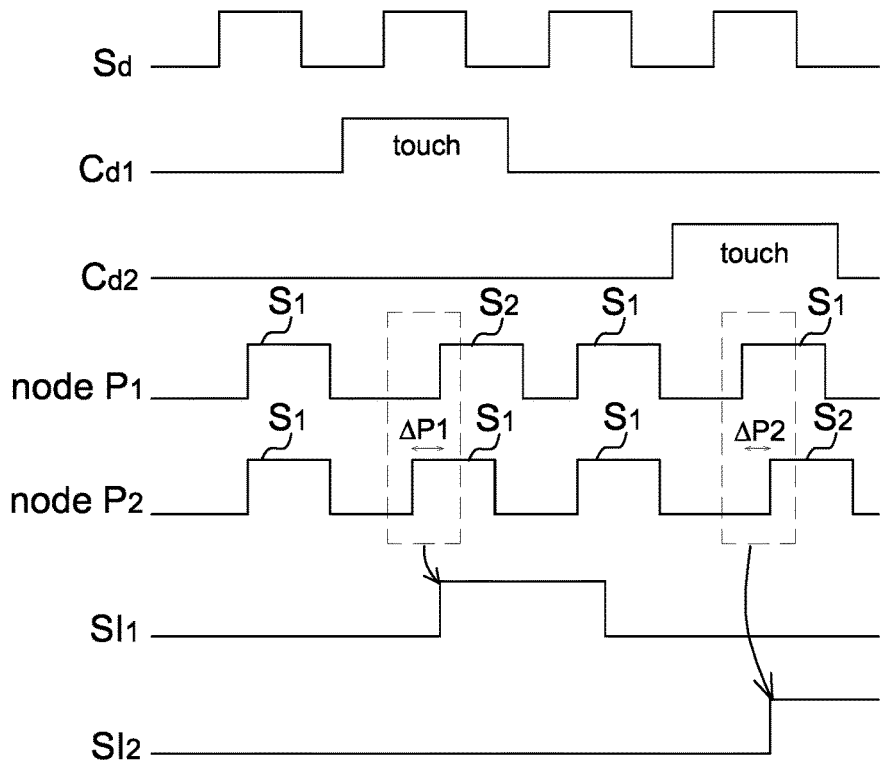
FIG. 5 is an operational schematic diagram of the capacitive switch of FIG. 4.

FIG. 5 is an operational schematic diagram of the capacitive switch 2 of FIG. 4. Please referring to FIGS. 4 and 5, the control unit 27 (or the drive unit 21) outputs identical drive signals Sd to the first detection circuit 231 and the second detection circuit 233. The first detection circuit 231 and the second detection circuit 233 are configured to detect a touch respectively according to the capacitance variation of the first detection capacitor Cd1 and the second detection capacitor Cd2. For example FIG. 5 respectively shows the capacitance variations caused by the object in contact with the first detection capacitor Cd1 and the second detection capacitor Cd2. In this embodiment, when the first detection circuit 231 and the second detection circuit 233 do not detect a touch, a first signal S1 is outputted according to the drive signal Sd; whereas when the first detection circuit 231 and the second detection circuit 233 detect the touch, a second signal S2 (e.g. signals shown at the node P1 and the node P2) is outputted according to the drive signal. The first identification unit 251 is configured to output a first identified signal SI1 according to a first phase shift $\Delta P1$ between the second signal S2 of the first detection circuit 231 and the first signal S1 of the second detection circuit 233. The second identification unit 253 is configured to output a second identified signal SI2 according to a second phase shift $\Delta P2$ between the second signal S2 of the second detection circuit 233 and the first signal S1 of the first detection circuit 231. As mentioned above, the first phase shift $\Delta P1$ and the second phase shift $\Delta P2$ are the phase difference between the detection signal rising edges or between the detection signal falling edges.

As mentioned above, according to different embodiments the first identification unit 251 and the second identification unit 253 respectively include a time to digital converter, a phase detector, a D flip-flop or an AND gate so as to output different identified signals SI1 and SI2 (as shown in FIG. 2A).

As mentioned above, the first comparison unit 2311 and the second comparison unit 2333 are configured to convert the first signal S1 and the second signal S2 to square signals such that the phase shifts $\Delta P1$ and $\Delta P2$ between the rising/falling edge of the detection signal and the rising/falling edge of the reference signal are identified easily, wherein the comparison units 2311 and 2333 also respectively include a slicer, an inverter or a buffer.

The control unit 27 then outputs a control signal Sc according to the first identified signal SI1 or the second identified signal SI2 to an electronic device for performing the corresponding control. It is appreciated that as the first detection circuit 231 and the second detection circuit 233 are replicas of each other in order to increase the detection accuracy, preferably the first detection circuit 231 and the second detection circuit 233 do not detect the touch at the same time. For example in one embodiment, the control unit 27 does not output the control signal Sc when the first detection circuit 231 and the second detection circuit 233 detect a touch simultaneously.

Figure 6:
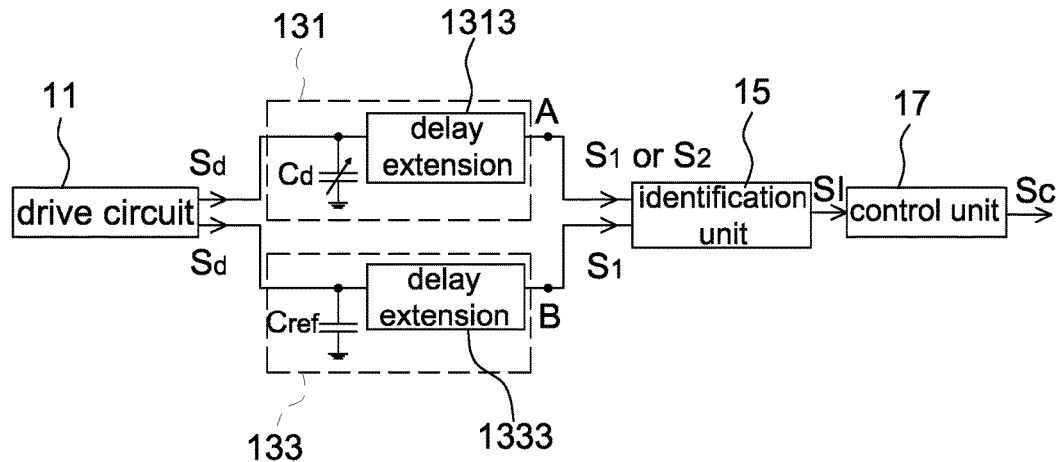
FIG. 6 is another schematic block diagram of the capacitive switch according to the first embodiment of the present disclosure, which includes a delay extension unit.

Referring to FIG. 6, it is another schematic block diagram of the capacitive switch 1 according to the embodiment of the present disclosure. In order to increase the identification sensitivity, in the present disclosure a delay extension circuit 1313 and 1333 is selectively disposed in the detection circuit 131 and the reference circuit 133, respectively, configured to extend the phase shift $\Delta P$ between the second signal S2 of the detection circuit 131 and the first signal S1 of the reference circuit 133. Operations of other elements are similar to those of FIG. 1 and thus details thereof are not repeated herein. In should be mentioned that although FIG. 6 is illustrated by using the first embodiment, the delay extension circuit is also applicable to the second embodiment of the present disclosure.

Figure 7A:
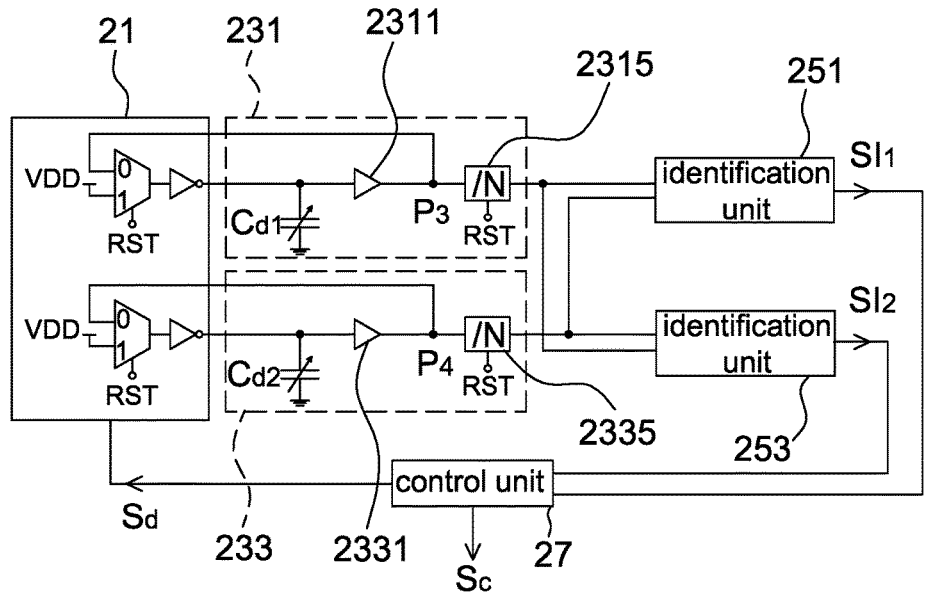
FIG. 7A is another schematic block diagram of the capacitive switch according to the second embodiment of the present disclosure, which includes a delay extension unit.

For example referring to FIG. 7A, it shows the second embodiment of the present disclosure in which the first detection circuit 231 and the second detection circuit 233 respectively include a delay extension circuit configured to extend the first phase shift $\Delta P1$ and the second phase shift $\Delta P2$ respectively. In this embodiment, the delay extension circuit is configured to feedback the first signal S1 and the second signal S2 outputted by the first detection circuit 231 and the second detection circuit 233 to the drive circuit 21. The first detection circuit 321 and the second detection circuit 233 include, for example, a delay line. The first phase shift $\Delta P1$ and the second phase shift $\Delta P2$ are extended by feeding the first signal S1 and the second signal S2 to repeatedly pass through the delay line.

Figure 7B:
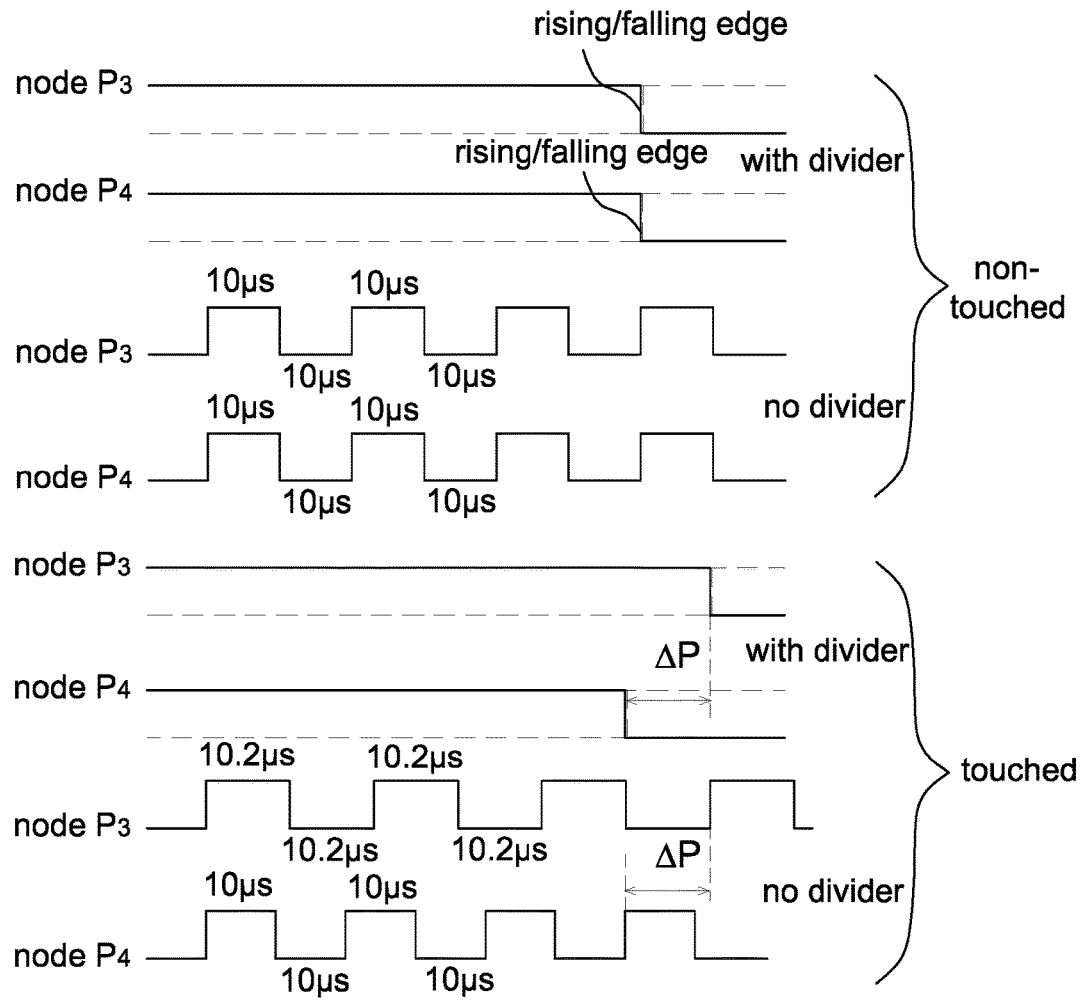
FIG. 7B is an operational schematic diagram of the capacitive switch of FIG. 7A.

Referring to FIG. 7B, it is an operational schematic diagram of the capacitive switch 2 of FIG. 7A. When the first detection circuit 231 and the second detection circuit 233 are not touched by an object (no touch), signals at the nodes P3 and P4 may have periods of 20 µs (10 µs signal duration). When the first detection circuit 231 is touched by the object (with touch), due to the capacitance variation the signal at the node P3 may have a period of 20.4 µs (10.2 µs signal duration) and the signal at the node P4 may still have the period of 20 µs (10 µs signal duration). Therefore, the first identification unit 251 outputs a first identified signal SI1 according to a phase shift $\Delta P$ between the output signal (e.g. at node P3) of the first detection circuit 231 and the output signal (e.g. at node P4) of the second detection circuit 233. As mentioned above, the first identification unit 251 identifies the occurrence of a touch even only when the phase shift $\Delta P$ exceeds a threshold.

In another embodiment, in order to allow the phase shift between the rising/falling edges of the detection signals each time outputted by the first detection circuit 231 and the second detection circuit 233 to be more obvious, the delay extension circuits of the first detection circuit 231 and the second detection circuit 233 respectively further include a divider 2315 and 2355 configured to perform the division operation on the feedbacked first signal S1 and the feedbacked second signal S2. For example referring to FIG. 7B, it shows the operation of the dividers 2315 and 2335 having a divisor equal to 4. For example when the first detection circuit 321 and the second detection circuit 233 are not touched by an object (no touch), the rising/falling edges of the detection signals at the nodes P3 and P4 outputted from the dividers 2315 and 2335 do not have a phase shift. When the first detection circuit 231 is touched by the object (with touch), the rising/falling edges of the detection signals at the nodes P3 and P4 outputted from the dividers 2315 and 2335 have the phase shift $\Delta P$. The first identification unit 251 also outputs a first identified signal SI1 according to the phase shift $\Delta P$ between the output signal of the first detection circuit 231 and the output signal of the second detection circuit 233.

It should be mentioned that if the second detection circuit 233 in FIG. 7A is not used to detect the object touch, the second detection circuit 233 has the same function as the reference circuit 133 of FIG. 1 and thus the second identification unit 253 may not be implemented. In other words, the delay extension circuit of FIG. 7A is also applicable to FIG. 1 configured to feedback the first signal S1 and the second signal S2 outputted by the detection circuit 131 to the drive circuit 11 and feedback the first signal S1 outputted by the reference circuit 133 to the drive circuit 11. The delay extension circuit also includes, for example, a divider configured to perform the division operation on the feedbacked first signal S1 and the feedbacked second signal S2 of the detection circuit 231 and perform the division operation on the feedbacked first signal S1 of the reference circuit 233.

In addition, the capacitive switch 1 of the present disclosure may include one reference circuit and a plurality of detection circuits for being applied to a plurality of switch devices. For example referring to FIG. 8, it is a schematic block diagram of the capacitive switch 3 according to a third embodiment of the present disclosure, which includes a plurality of detection circuits 131, 131' . . . and a reference circuit 133 being replicas of each other, wherein each of the detection circuits 131, 131' . . . and the reference circuit 133 may be implemented according to FIGS. 1, 3 and 6-7. The detection circuits 131, 131' . . . are coupled to the identification unit 15 through, for example, a multiplexer 19. Accordingly, the identification unit 15 sequentially compares a phase shift between the second signal S2 of each of the detection circuits 131, 131' . . . and the first signal S1 of the reference circuit 133 so as to output an identified signal (as shown in FIG. 2A). In other words, the capacitive switch according to the embodiment of the present disclosure includes at least one detection circuit and a reference circuit being replicas of each other, wherein methods of the drive circuit 11 outputting the drive signal Sd and the identification unit 15 identifying the phase shift between output signals of each of the detection circuits 131, 131' . . . and the reference circuit 133 are similar to those of the first embodiment and thus details thereof are not repeated herein.

Figure 9:
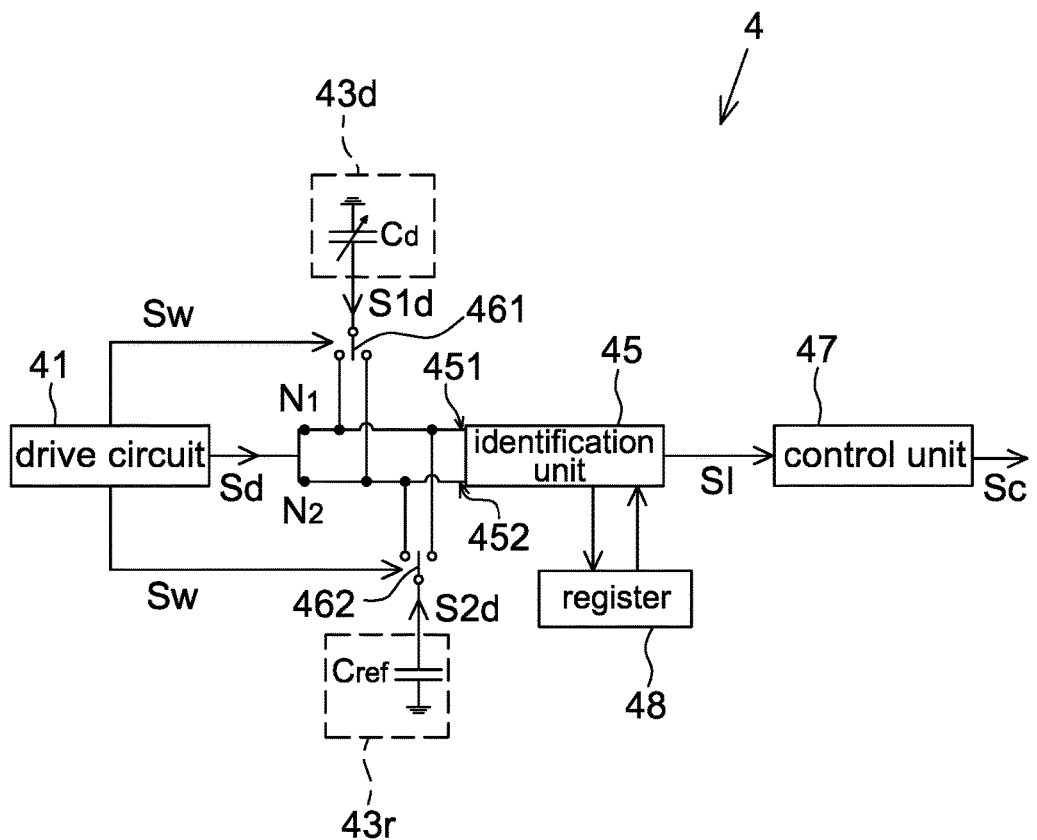
FIG. 9 is a schematic block diagram of a capacitive switch according to a fourth embodiment of the present disclosure.

Referring to FIG. 9, it is a schematic block diagram of a capacitive switch 4 according to a fourth embodiment of the present disclosure. The capacitive switch 4 includes a drive circuit 41, at least one capacitive detection circuit (only one capacitive detection circuit 43d being shown herein), a capacitive reference circuit 43r, an identification unit 42 and a register 48, wherein the register 48 is electrically coupled to or integrated in the identification unit 45.

The drive circuit 41 is configured to output a drive signal Sd and a switching signal Sw, wherein the drive circuit 41 periodically or non-periodically outputs the drive signal Sd to a first node N1 and a second node N2. In this embodiment, the capacitive switch 4 further includes a first switching element 461 and a second switching element 462. The first switching element 461 is configured to couple the capacitive detection circuit 43d to the first node N1 or the second node N2 according to the switching signal Sw. The second switching element 462 is configured to couple the capacitive reference circuit 43r to the second node N2 or the first node N1 according to the switching signal Sw.

The capacitive detection circuit 43d includes a detection capacitor Cd and is configured to generate a first detection signal S1d according to the drive signal Sd, i.e. the first detection signal S1d is generated by the drive signal Sd charging the detection capacitor Cd. As mentioned above, the capacitive detection circuit 43d is configured to detect a touch according to a capacitance variation of the detection capacitor Cd. No matter whether the touch is detected, the capacitive detection circuit 43d generates and outputs the first detection signal S1d according to the drive signal Sd. It should be mentioned that as a charging curve of the detection capacitor Cd is changed when the touch is detected to cause a phase delay, the first detection signal S1d has the phase delay corresponding to detected touch.

The capacitive reference circuit 43r includes a reference capacitor Cref and is configured to generate a second detection signal S2d according to the drive signal Sd. Generally speaking, as the capacitive reference circuit 43r is used to be compared with the capacitive detection circuit 43d, a total capacitance value of the capacitive reference circuit 43r is preferably identical to a total capacitance value of the untouched capacitive detection circuit 43d. In one embodiment, the capacitive reference circuit 43r is a replica of the capacitive detection circuit 43d, and thus a capacitance value of the reference capacitor Cref is identical to that of the detection capacitor Cd, but the present disclosure is not limited thereto. In other embodiments, the capacitive reference circuit 43r is not a replica circuit of the capacitive detection circuit 43d as long as the equivalent capacitance of the capacitive reference circuit 43r is substantially identical to the equivalent capacitance of the capacitance detection circuit 43d.

The identification unit 45 includes a first input terminal 451 and a second input terminal 452 respectfully coupled to the first node N1 and the second node N2. The identification unit 45 is configured to identify a phase shift between inputted detection signals received by the first input terminal 451 and the second input terminal 452 (i.e. between the first detection signal S1d and the second detection signal S2d) and output an identified signal SI (described later), wherein the identification unit 45 further includes, for example, a time to digital converter (TDC), a phase detector (PD), a D flip-flop (DFF) or an AND gate configured to identify the phase shift between the first detection signal S1d and the second detection signal S2d.

Figure 10A:
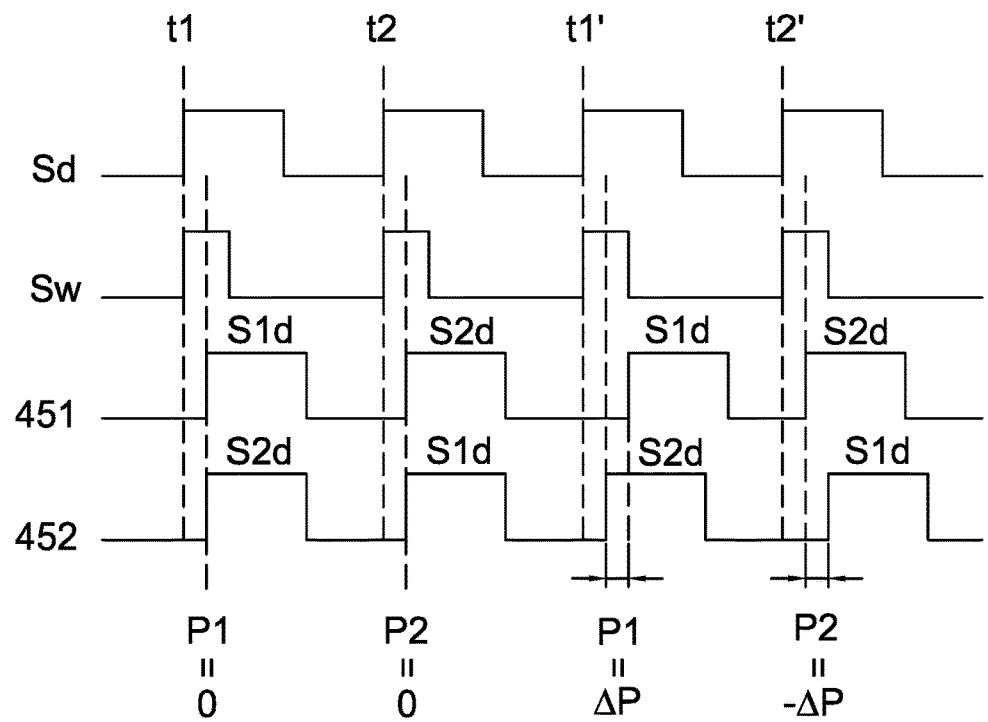
FIGS. 10A-10B are operational schematic diagrams of the capacitive switch of FIG. 9.

Referring to FIG. 10A, it is an operational schematic diagram of the capacitive switch 4 of FIG. 9. Referring to FIGS. 9 and 10A, the drive circuit 41, for example, periodically outputs the drive signal Sd and the switching signal Sw, wherein for illustration purpose the drive signal Sd and the switching signal Sw are shown as square waves, but not limited thereto. The capacitive detection circuit 43d is sequentially coupled to the first node N1 and the second node N2 according to the switching signal Sw, and the capacitive reference circuit 43r is sequentially coupled to the second node N2 and the first node N1 according to the switching signal Sw. In one embodiment, the drive circuit 41 controls, through the switching signal Sw, the capacitive detection circuit 43d to be coupled to the first node N1 and the capacitive reference circuit 43r to be coupled to the second node N2 at a first time t1; and controls, through the switching signal Sw, the capacitive detection circuit 43d to be coupled to the second node N2 and the capacitive reference circuit 43r to be coupled to the first node N1 at a second time t2. It should be mentioned that a time interval (e.g. from the first time t1 to the second time t2) during which the capacitive detection circuit 43d is being coupled to the first node N1 or the second node N2 is preferably longer than at least one period of the drive signal Sd such that the drive signal Sd has enough time to charge the detection capacitor Cd and generate the first detection signal S1d, and it is the same to the capacitive reference circuit 43r. It is appreciated that the drive signal Sd and the switching signal Sw outputted by the drive circuit 41 are not limited to those shown in FIG. 10A and may be determined according to actual applications.

Referring to FIGS. 9 and 10A continuously, it is assumed that there is no offset between the capacitive detection circuit 43d and the capacitive reference circuit 43r and there is no conductor (e.g. a finger or a touch stylus) in contact with the capacitive detection circuit 43d before a first time t1'. There is no phase shift between the first detection signal S1d, which is generated by the capacitive detection circuit 43d and received from the first input terminal 451 corresponding to the first time t1, and the second detection signal Sd2, which is generated by the capacitive reference circuit 43r and received from the second input terminal 452 corresponding to the first time t1. Thus the identification unit 45 identifies, corresponding to the first time t1, that a first phase shift P1 between the inputted detection signals received by the first input terminal 451 and the second input terminal 452 is 0 and stores the first phase shift P1 to the register 48. Next, within the second time t2, the first input terminal 451 receives the second detection signal S2d and the second input terminal 452 receives the first detection signal S1d. The identification unit 45 then identifies, corresponding to the second time t2, that a second phase shift P2 between the inputted detection signals received by the first input terminal 451 and the second input terminal 452 is 0. After the second phase shift P2 is obtained, the identification unit 45 reads the first phase shift P1 from the register 48 and calculates a comparison result to be 0 (e.g. a difference value being 0 or a ratio being 0) between the first phase shift P1 and the second phase shift P2 so as to identify that the capacitive detection circuit 43d does not detect a touch.

It should be mentioned that the register 48 is configured to store information related to the first phase shift P1, wherein a data type of the information related to the first phase shift P1 is determined according to the type of the identification unit 45. For example, when the identification unit 45 includes a time to digital converter, the register 48 stores digital data containing the information related to the first phase shift P1, wherein the digital data has 2 bits, 4 bits and so on without particular limitations.

Referring to FIGS. 9 and 10A continuously, it is assumed that a conductor touches the capacitive detection circuit 43d at the first time t1', the first input terminal 451 receives the first detection signal S1d corresponding to the first time t1'; meanwhile, the second input terminal 452 receives the second detection signal S2d. The identification unit 45 identifies that the first phase shift P1 is not zero, indicated as ΔP, and stores information containing the first phase shift P1 in the register 48. Next, through switching the connections of the capacitive detection circuit 43d and the capacitive reference circuit 43r, the first input terminal 451 receives the second detection signal S2d corresponding to the second time t2'; meanwhile, the second input terminal 452 receives the first detection signal S1d corresponding to the second time t2'. The identification unit 45 then identifies that the second phase difference P2 is not zero, indicated as −ΔP. After the second phase shift P2 is obtained, the identification unit 45 reads the information of the first phase shift P1 from the register 48 and calculates a comparison result not to be zero (e.g. a difference value 2ΔP or a ratio −1) between the first phase shift P1 and the second phase shift P2. Accordingly, the identification unit 45 identifies that the capacitive detection circuit 43d detects a touch. It should be mentioned that the positive and negative values of the phase shift ΔP mentioned above are only intended to illustrate but not to limit the present disclosure. The phase shift ΔP is indicated according to the calculation method of the identification unit 45.

It should be mentioned that, in actual operation the capacitive switch can be interfered by environment (e.g. the change of temperature) to change a circuit parameter of the circuit thereof to cause identification errors. For example referring to FIGS. 1 and 2C, if it is assumed that the circuit parameter of a circuit path passing the detection circuit 131 and the node A in FIG. 1 is changed due to the temperature variation, a phase shift exists between the first signal S1 at the node A and the second signal S2 at the node B even the detection circuit 131 is not touched. In this case, the identification unit 15 identifies that the detection circuit 131 detects a touch according to the phase shift and output the identified signal SI.

More specifically speaking, even the detection circuit 131 and the reference circuit 133 of FIG. 1 are replicas of each other, and a first path of the detection circuit 131 passing the node A to the identification unit 15 has an identical circuit parameter to a second path of the reference circuit 133 passing the node B to the identification unit 15, a mismatch between the first path and the second path can still be induced by the variation of working temperature or the offset of manufacturing process such that the identification unit 15 mistakenly identifies that the capacitive switch 1 detects a touch.

Figure 10B:
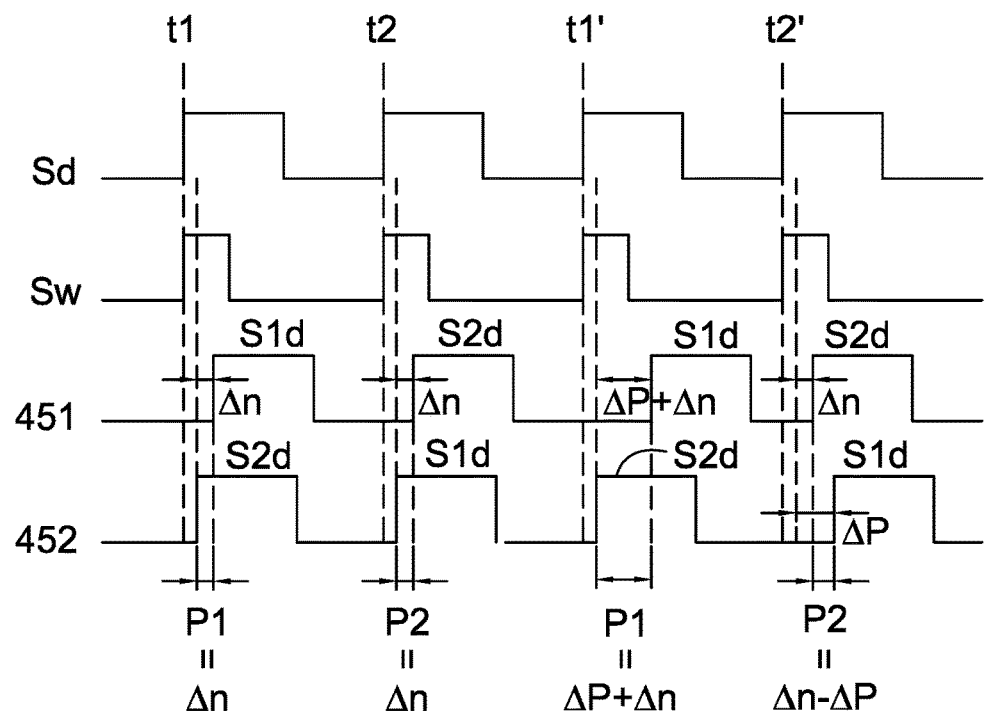

The capacitive switch 4 of the fourth embodiment in the present disclosure is able to further eliminate the offset in circuit or low frequency noise to improve the detection accuracy. Referring to FIGS. 9 and 10B, the method of the capacitive switch 4 eliminating the phase shift caused by the circuit offset or the low frequency noise is illustrated hereinafter.

It is assumed that the circuit parameter of a path passing the first node N1 to the first input terminal 451 is different from the circuit parameter of a path passing the second node N2 to the second input terminal 452 due to different manufacturing processes or environmental factors. When the capacitive detection circuit 43d is not touched at a first time t1, the identification unit 45 identifies a first phase shift P1 corresponding to a first time t1 and a second phase shift P2 corresponding to a second time t2, wherein the first phase shift P1 and the second phase shift P2 are both equal to Δn. It should be mentioned that the phase shift Δn is used to indicate an offset of the capacitive switch 4 caused by environmental interference or a phase shift caused by low frequency noise. Next, the identification 45 calculates a difference value to be 0 between the first phase shift P1 and the second phase shift P2 to accordingly identify that the capacitive detection circuit 43d does not detect a touch.

When the capacitive detection circuit 43d is touched at the first time t1', the identification unit 45 identifies the first phase shift P1 corresponding to the first time t1' and the second phase shift P2 corresponding to a second time t2', wherein the first phase shift P1 is (ΔP+Δn) and the second phase shift P2 is (Δn−ΔP). Next, the identification unit 45 calculates a difference value not to be zero, which is indicated as 2ΔP by cancelling out the phase offset Δn, between the first phase shift P1 and the second phase shift P2 to accordingly identify that the capacitive detection circuit 43d detects a touch.

It should be mentioned that although a path of the first node N1 is shown to lag a path of the second node N2 in FIG. 10B for illustration purpose, the present disclosure it not limited thereto. The phase offset Δn of the circuit can also be cancelled out in a condition that the path of the first node N1 leads the path of the second node N2. Similarly, the indication of the phase shift above is only intended to illustrate but not to limit the present disclosure.

In some embodiments, to improve the detection accuracy the identification unit 45 further outputs an identified signal SI when identifying that the difference value exceeds a difference threshold so as to indicate a touch is detected by the capacitive detection circuit 43d. For example, the difference value is 0 when the touch is not detected and the difference value is 2ΔP when the touch is detected, and in this case the difference threshold is set to any value between 0 to 2ΔP. It is appreciated that the difference threshold is determined previously according to the required detection sensitivity and a value of the comparison result (e.g. a difference value or a ratio) between the first phase shift P1 and the second phase shift P2 when the touch is detected.

In some embodiments, the capacitive switch 4 further includes a control unit 47. When the identification unit 45 identifies that the capacitive detection circuit 43$d$ detects a touch, the identified signal SI is outputted to the control unit 47 such that the control unit 47 outputs a control signal Sc to an electronic device according to the identified signal SI to perform the corresponding control, but the present disclosure is not limited thereto. In some embodiments, no matter whether the identification unit 45 identifies a detection state of the capacitive detection circuit 43$d$ to be "touched" or "non-touched", the identified signal SI is outputted, wherein the identified signal SI contains information of a detection state to indicate the detection state of the capacitive detection circuit 43$d$.

As a difference value between the first phase shift P1 and the second phase shift P2 cancels out the phase shift Δn due to the circuit offset or low frequency noise, in some embodiments the control unit 47 or other components read the first phase shift P1 and the second phase shift P2 (or the difference value) from the identification unit 45 or the register 48 to correctly calculate a capacitance variation of the detection capacitor Cd. In addition, in some embodiments the control unit 47 or other components calculate the phase shift Δn according to the first phase shift P1 and the second phase shift P2 (e.g. calculating a sum of the first phase shift P1 and the second phase shift P2) thereby calibrating the capacitive switch 4.

Figure 8:
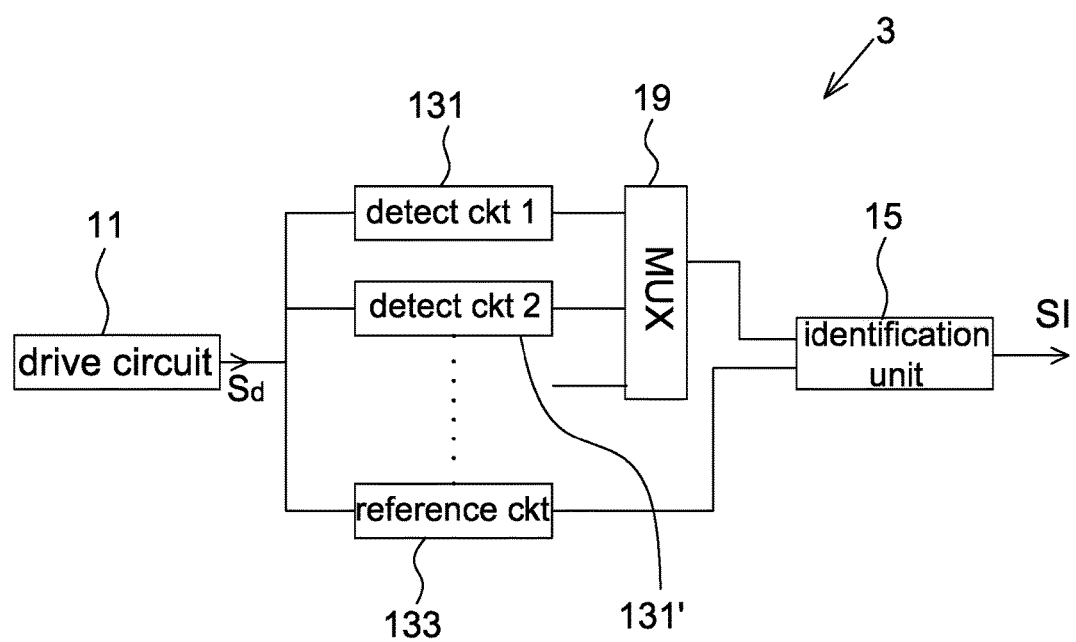
FIG. 8 is a schematic block diagram of a capacitive switch according to a third embodiment of the present disclosure, which includes a plurality of detection circuits.
Figure 11A:
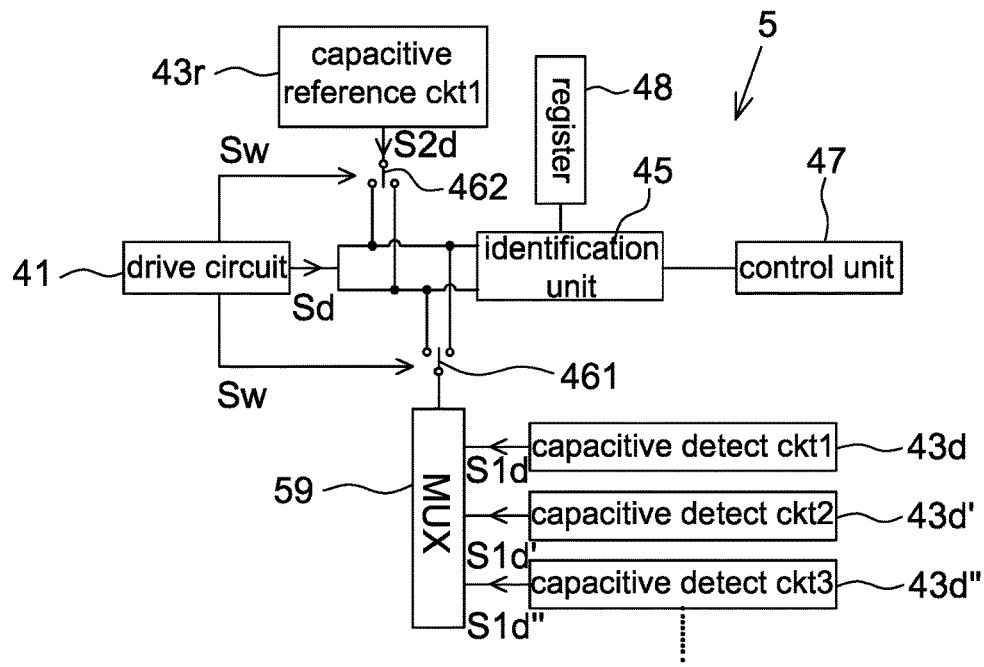
FIG. 11A is a schematic block diagram of a capacitive switch according to a fifth embodiment of the present disclosure, which includes a plurality of capacitive detection circuits.

In addition, similar to the third embodiment (as shown in FIG. 8) of the present disclosure, it is possible for the capacitive switch 4 of the present disclosure to include one capacitive reference circuit and a plurality of capacitive detection circuits to be applied to a plurality of switches (or press keys). For example referring to FIG. 11A, it is a schematic block diagram of a capacitive switch 5 according to a fifth embodiment of the present disclosure, wherein the capacitive switch 5 includes a plurality of capacitive detection circuits 43$d$, 43$d'$, 43$d''$, ... and a capacitive reference circuit 43$r$ being replicas of each other. The capacitive detection circuits 43$d$, 43$d'$, 43$d''$, ... are coupled to a first switching element 461 via, for example, a multiplexer 59 such that the identification unit 45 sequentially, through switching the connections of the capacitive reference circuit 43$r$ and the multiplexer 59 and the operation of the multiplexer 59, identifies a first phase shift and a second phase shift between a first detection signal S1$d$ generated by the capacitive detection circuit 43$d$ and a second detection signal S2$d$ generated by the capacitive reference circuit 43$r$, identifies a first phase shift and a second phase shift between a first detection signal S1$d'$ generated by the capacitive detection circuit 43$d'$ and a second detection signal S2$d$ generated by the capacitive reference circuit 43$r$ and so on, to accordingly identify detection states of the capacitive detection circuits 43$d$, 43$d'$, 43$d''$, ..., respectively. The identification method is identically to that of the fourth embodiment and thus details thereof are not repeated herein.

Figure 11B:
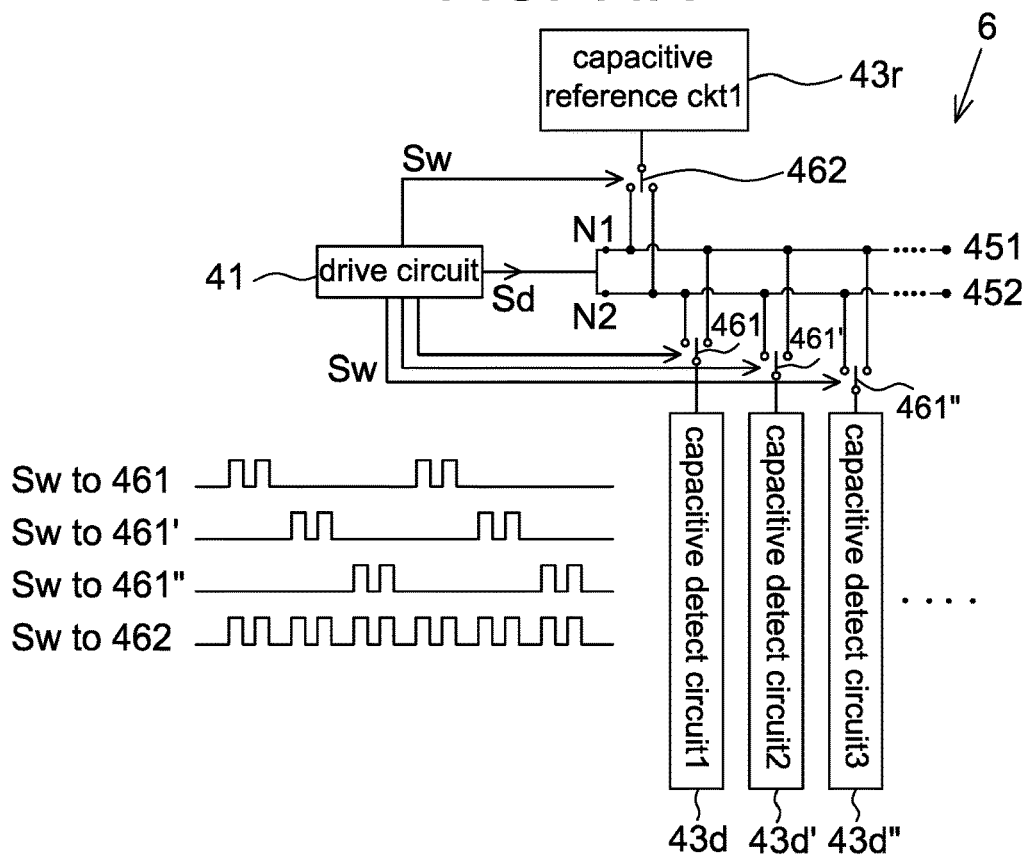
FIG. 11B is a schematic block diagram of a capacitive switch according to a sixth embodiment of the present disclosure, which includes a plurality of capacitive detection circuits.

In addition, referring to FIG. 11B, it is a schematic block diagram of a capacitive switch 6 according to a sixth embodiment of the present disclosure. Similar to the fifth embodiment, the capacitive switch 6 includes a plurality of capacitive detection circuits 43$d$, 43$d'$, 43$d''$, ... and a capacitive reference circuit 43$r$ being replicas of each other. The capacitive switch 6 further includes a plurality of switching elements 461, 461', 461", ... corresponding to the capacitive detection circuits 43$d$, 43$d'$, 43$d''$, ..., and the switching elements 461, 461', 461", ... are configured to sequentially couple the capacitive detection circuits 43$d$, 43$d'$, 43$d''$, ... to a first node N1 and a second node N2 directly according to a plurality of switching signals Sw (e.g. generated by a drive circuit). Accordingly, the capacitive switch 6 is possible to respectively identify detection states of the capacitive detection circuits, and the identification method is similar to that of the fourth embodiment and thus details thereof are not repeated herein. It should be mentioned that the switching signals Sw shown in FIG. 11B are only intended to illustrate a switching way of the switching elements 461, 461', 461", ... but not to limit the present disclosure.

Figure 12:
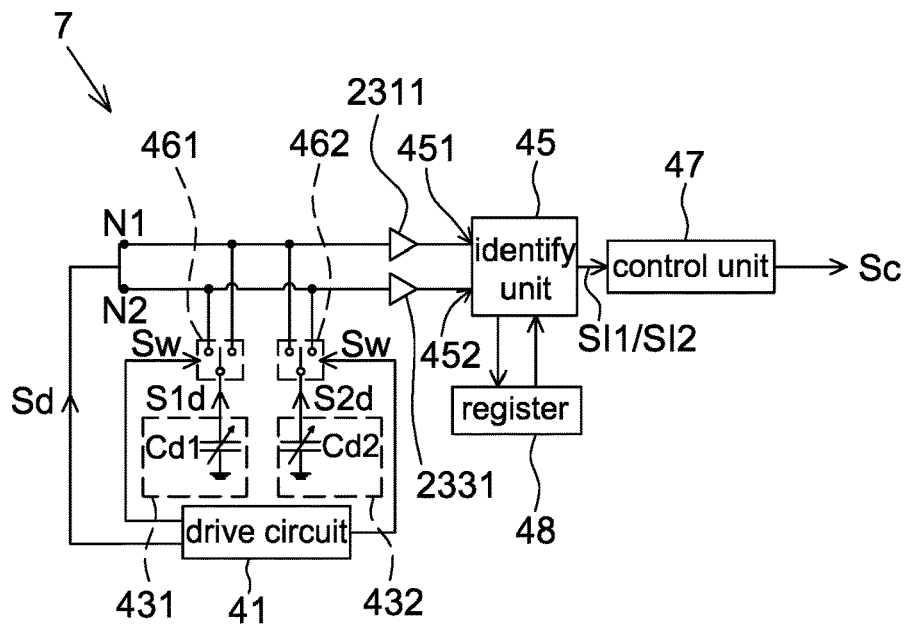
FIG. 12 is a schematic block diagram of a capacitive switch according to a seventh embodiment of the present disclosure.

Referring to FIG. 12, it is a schematic block diagram of a capacitive switch 7 according to a seventh embodiment of the present disclosure. The capacitive switch 7 includes a drive circuit 41, a first switching element 461, a second switching element 462, a first capacitive detection circuit 431, a second capacitive detection circuit 432, an identification unit 45 and a register 48. In this embodiment, the first capacitive detection circuit 431 includes a detection capacitor Cd1 and the second capacitive detection circuit 452 includes a detection capacitor Cd2. A first input terminal 451 and a second input terminal 452 of the identification unit 45 are respectively coupled with a comparison unit (shown as the first comparison unit 2311 and a second comparison unit 2331) configured to convert the received detection signal to square wave. As mentioned above, the first comparison unit 2311 and the second comparison unit 2331 may not be implemented. It should be mentioned that the difference between the seventh embodiment and the fourth embodiment is that the first capacitive detection circuit 431 and the second capacitive detection circuit 432 in the seventh embodiment are both used to detect a touch. More specifically speaking, the second capacitive detection circuit 432 is configured as a reference circuit of the first capacitive detection circuit 431 when a conductive object touches the first capacitive detection circuit 431, and vice versa. In one embodiment, the first capacitive detection circuit 431 and the second capacitive detection circuit 432 are replicas of each other in the seventh embodiment, wherein the detection capacitors Cd1 and Cd2 have identical predetermined capacitance, but the present disclosure is not limited thereto.

The first capacitive detection circuit 431 is coupled to a first node N1 at a first time and coupled to a second node N2 at a second time t2 via the first switching element 461 to accordingly generate a first detection signal S1$d$ according to a drive signal Sd. The second capacitive detection circuit 432 is coupled to the second node N2 at the first time and coupled to the first node N1 at the second time t2 via the second switching element 462 to accordingly generate a second detection signal S2$d$ according to a drive signal Sd.

Referring to FIGS. 10B and 12, at the first times t1 and t1', the first capacitive detection circuit 431 is coupled, via the first switching element 461, to the first node N1 and the second capacitive detection circuit 432 is coupled, via the second switching element 462, to the second node N2; at the second times t2 and t2', the first capacitive detection circuit 431 is coupled, via the first switching element 461, to the second node N2 and the second capacitive detection circuit 432 is coupled, via the second switching element 462, to the first node N1. Similar to the fourth embodiment, the identification unit 45 identifies a first phase shift P1 (e.g. Δn) corresponding to the first time t1 and identifies a second phase shift P2 (e.g. Δn) corresponding to the second time t2, and calculates a difference value between the first phase shift P1 and the second phase shift P2. Next, the identification unit 45 identifies a first phase shift P1 (e.g. ΔP+Δn) corresponding to the first time t1' and identifies a second phase shift P2 (e.g. Δn−ΔP) corresponding to the second time t2', and calculates a difference value between the first phase shift P1 and the second phase shift P2. It should be mentioned that in addition to identify whether a difference value between the first phase shift P1 and the second phase shift P2 exceeds a difference threshold, the identification unit 45 further generates a first identified signal SI1 or a second identified signal SI2 according to the first phase shift P1 (or the second phase shift P2) indicating that the first capacitive detection circuit 431 or the second capacitive detection circuit 432 detects a touch.

More specifically speaking, taking FIG. 10B as an example, when the first phase shift P1 is ΔP+Δn corresponding to the first time t1' and the second phase shift P2 is Δn−ΔP corresponding to the second time t2', the identification unit 45 identifies that the difference value (i.e. 2ΔP) between the first phase shift P1 and the second phase shift P2 is not 0. If it is assumed that an inputted detection signal received by the second input terminal 452 leads an inputted detection signal received by the first input terminal 451, the phase shift between the two inputted detection signals (e.g. the phase shift ΔP or Δn) is defined as a positive phase shift. As the phase delay caused by the touch of a conductive object on the capacitive switch is larger than the phase delay caused by the circuit offset or low frequency noise, e.g. ΔP>Δn, in FIG. 10B the first phase shift P1 (i.e. ΔP+Δn) is considered as a positive value and the second phase shift P2 (i.e. Δn−ΔP) is considered as a negative value. In this case, the identification unit 45 generates the first identified signal SI1 to indicate a touch detected by the first capacitive detection circuit 431 when the first phase shift P1 is larger than 0 or the second phase shift P2 is smaller than 0. Similarly, if the identification unit 45 identifies that the first phase shift P1 is smaller than 0 or the second phase shift P2 is larger than 0, a second identified signal SI2 is generated to indicate that the second capacitive detection circuit 432 detects a touch, but the present disclosure is not limited thereto. When the definition of the positive/negative phase shift is different, the identified signal outputted according to the positive/negative value of the first phase shift P1 and the second phase shift P2 is different. In other embodiments, after the identification unit 45 identifies that the difference value between the first phase shift P1 and the second phase shift P2 is not 0 or exceeds the difference threshold (indicating that a conductive object touches the first capacitive detection circuit 431 or the second capacitive detection circuit 432), as long as the identification unit 45 is able to identify that an inputted detection signal of the first input terminal 451 leads or lags an inputted detection signal of the second input terminal 452, the first identified signal SI1 or the second identified signal SI2 is generated accordingly to indicate a detection state of the first capacitive detection circuit 431 or second capacitive detection circuit 432.

In this embodiment, other parts of the drive circuit 41, the first switching element 461, the second switching element 462, the identification unit 45 and the register 48 not further illustrated are similar to those of the fourth embodiment and thus details thereof are not repeated herein.

Figure 13:
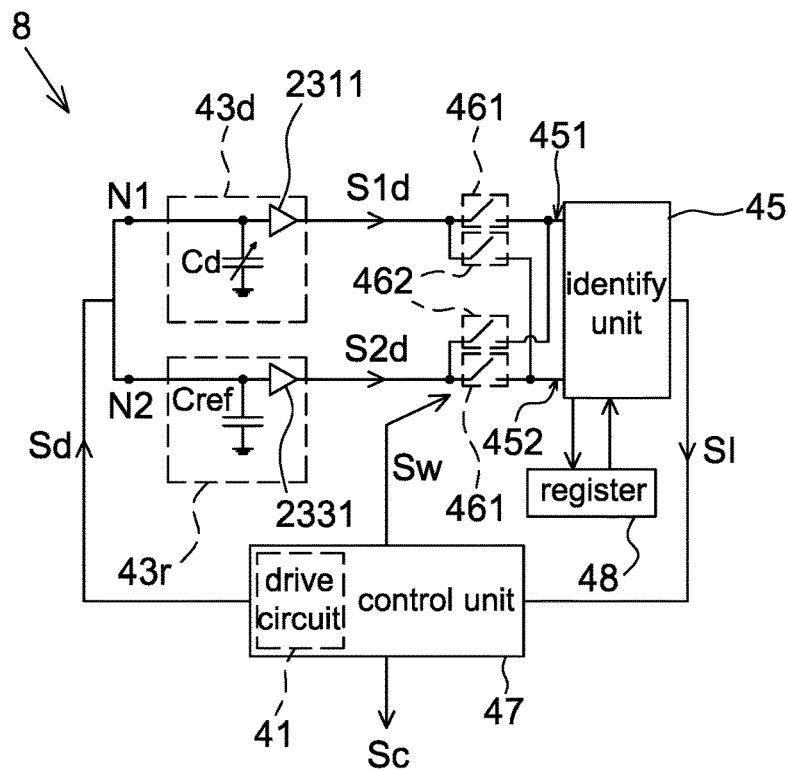
FIG. 13 is a schematic block diagram of a capacitive switch according to an eighth embodiment of the present disclosure.

Referring to FIG. 13, it is a schematic block diagram of a capacitive switch 8 according to an eighth embodiment of the present disclosure. The capacitive switch 8 includes a control unit 47, at least one capacitive detection circuit 43d, a capacitive reference circuit 43r, an identification unit 45 and a register 48, wherein a drive circuit 41 is integrated in the control unit 47 such that the control unit 47 is configured to output a drive signal Sd to a first node N1 and a second node N2, and output a switching signal Sw. The identification unit 45 includes a first input terminal 451 and a second input terminal 452. In this embodiment, the capacitive detection circuit 43d includes a detection capacitor Cd and a first comparison unit 2311, and the capacitive reference circuit 43r includes a reference capacitor Cref and a second comparison unit 2331.

It should be mentioned that the difference between the eighth embodiment and the fourth embodiment is that in the eighth embodiment the capacitive detection circuit 43d is constantly coupled to the control unit 47 via the first node N1 so as to generate a first detection signal S1d according to the drive signal Sd, and the capacitive reference circuit 43r is constantly coupled to the control unit 47 via the second node N2 so as to generate a second detection signal S2d according to the drive signal Sd. In addition, the capacitive switch 8 further includes a first switching element set 461 and a second switching element set 462, wherein the first switching element set 461 is configured to, at a first time, couple the capacitive detection circuit 43d to the first input terminal 451 and couple the capacitive reference circuit 43r to the second input terminal 452 according to the switching signal Sw; and the second switching element set 462 is configured to, at a second time, couple the capacitive detection circuit 43d to the second input terminal 452 and couple the capacitive reference circuit 43r to the first input terminal 451 according to the switching signal Sw. Accordingly, the identification unit 45 identifies a first phase shift between corresponding signal edges of the first detection signal S1d received by the first input terminal 451 and the second detection signal S2d received by the second input terminal 452 corresponding to the first time, identifies a second phase shift between corresponding signal edges of the second detection signal S2d received by the first input terminal 451 and the first detection signal S1d received by the second input terminal 452 corresponding to the second time, and outputs an identified signal SI to the control unit 47 when identifying that a difference value or a ratio between the first phase shift and the second phase shift exceeds a difference threshold to indicate a detection state of the capacitive detection circuit 43d, wherein the operation of the identification unit 45 is similar to that of the fourth embodiment and thus details thereof are not repeated therein. In this embodiment, it is possible to separately arrange the drive circuit 41 and the control unit 47 as shown in FIG. 9.

As mentioned above, to improve the detection sensitivity, a delay extension circuit is applicable to the fourth to eighth embodiments of the present disclosure. For example, referring to FIG. 13, the delay extension circuit is respectively disposed in the capacitive detection circuit 43d and the capacitive reference circuit 43r, or respectively disposed at the first input terminal 451 and the second input terminal 452 of the identification unit 45 to extend a phase shift of the detection signal.

It should be mentioned that each switching signal Sw (e.g. square wave) in FIGS. 10B and 11B indicates a connection point of the switching element being switched from the first node to the second node or switched from the second node to the first node, but the present disclosure is not limited thereto. When a plurality of switching elements is included, it is possible to switch the switching elements by digital signals without particular limitations. The control unit in the present disclosure is integrated in a microprocessor (MCU) or a central processing unit (CPU), and implemented by hardware, firmware and/or software.

As mentioned above, the conventional capacitive detection circuit has low detection accuracy due to the offset of environmental interference or low frequency noise. Therefore, the present disclosure further provides a capacitive switch (FIGS. 9, 11A, 11B, 12 and 13) that generates two phase shift signals by switching the detection signal inputted into the identification unit and identifies whether a touch is detected according to a comparison result of comparing the two phase shift signals. As the comparison result between the two phase shift signals cancels the phase offset caused by the circuit offset or low frequency noise, the capacitive switch provided by the present disclosure has higher detection accuracy.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A capacitive switch, comprising:
    a drive circuit configured to output a drive signal to a first circuit path and a second circuit path;
    a capacitive detection circuit configured to be coupled to the first circuit path at a first time to generate a first detection signal, and coupled to the second circuit path at a second time to generate a second detection signal;
    a capacitive reference circuit configured to be coupled to the second circuit path at the first time to generate a third detection signal, and coupled to the first circuit path at the second time to generate a fourth detection signal; and
    an identification unit electrically connected to the first circuit path and the second circuit path, and configured to identify a first phase shift between the first detection signal and the third detection signal, identify a second phase shift between the second detection signal and the fourth detection signal, and calculate a difference value between the first phase shift and the second phase shift.

2. The capacitive switch as claimed in claim 1, wherein when the difference value exceeds a difference threshold, the identification unit is further configured to output an identified signal indicating a touch detected by the capacitive detection circuit.

3. The capacitive switch as claimed in claim 1, further comprising a register coupled to the identification unit and configured to store information related to the first phase shift.

4. The capacitive switch as claimed in claim 3, wherein the first time is prior to the second time.

5. The capacitive switch as claimed in claim 1, further comprising:
    a first switching element configured to couple the capacitive detection circuit to the first circuit path or the second circuit path; and
    a second switching element configured to couple the capacitive reference circuit to the second circuit path or the first circuit path.

6. The capacitive switch as claimed in claim 1, further comprising a delay extension circuit configured to extend the first phase shift and the second phase shift.

7. The capacitive switch as claimed in claim 1, further comprising a comparison unit configured to convert the first detection signal, the second detection signal, the third detection signal and the fourth detection signal to square waves.

8. The capacitive switch as claimed in claim 7, wherein the comparison unit comprises a slicer, an inverter or a buffer.

9. The capacitive switch as claimed in claim 1, wherein the capacitive reference circuit is a replica circuit of the capacitive detection circuit.

10. The capacitive switch as claimed in claim 1, wherein the identification unit comprises a time to digital converter, a phase detector, a D flip-flop or an AND gate configured to identify the first phase shift and the second phase shift.

11. A capacitive switch, comprising:
    a drive circuit configured to output a drive signal to a first circuit path and a second circuit path;
    a capacitive detection circuit electrically connected to the first circuit path;
    a capacitive reference circuit electrically connected to the second circuit path; and
    an identification unit comprising a first input terminal and a second input terminal, wherein
        the first input terminal is coupled to the first circuit path at a first time to receive a first detection signal generated by the capacitive detection circuit and coupled to the second circuit path at a second time to receive a second detection signal generated by the capacitive reference circuit,
        the second input terminal is coupled to the second circuit path at the first time to receive a third detection signal generated by the capacitive reference circuit and coupled to the first circuit path at the second time to receive a fourth detection signal generated by the capacitive detection circuit, and
        the identification unit is configured to identify a first phase shift between the first detection signal and the third detection signal, and identify a second phase shift between the second detection signal and the fourth detection signal.

12. The capacitive switch as claimed in claim 11, wherein the identification unit is further configured to
    compare a difference value or a ratio between the first phase shift and the second phase shift with a difference threshold, and
    output an identified signal indicating a detection state of the capacitive detection circuit.

13. The capacitive switch as claimed in claim 11, further comprising:
    a first switching element set configured to couple the first input terminal to the first circuit path or the second circuit path; and
    a second switching element set configured to couple the second input terminal to the second circuit path or the first circuit path.

14. The capacitive switch as claimed in claim 11, wherein the capacitive reference circuit is a replica circuit of the capacitive detection circuit.

15. The capacitive switch as claimed in claim 11, further comprising a register coupled to the identification unit and configured to store information related to the first phase shift.

16. The capacitive switch as claimed in claim 11, further comprising a delay extension circuit configured to extend the first phase shift and the second phase shift.

17. The capacitive switch as claimed in claim 11, further comprising a comparison unit configured to convert the first detection signal, the second detection signal, the third detection signal and the fourth detection signal to square waves.

18. The capacitive switch as claimed in claim 11, wherein the identification unit comprises a time to digital converter, a phase detector, a D flip-flop or an AND gate configured to identify the first phase shift and the second phase shift.

19. A capacitive switch, comprising:
- a drive circuit configured to output a drive signal to a first circuit path and a second circuit path;
- a multiplexer,
- a plurality of capacitive detection circuits, one of the plurality of capacitive detection circuits being configured to be coupled to the first circuit path via the multiplexer at a first time to generate a first detection signal, and coupled to the second circuit path via the multiplexer at a second time to generate a second detection signal;
- a capacitive reference circuit configured to be coupled to the second circuit path at the first time to generate a third detection signal, and coupled to the first circuit path at the second time to generate a fourth detection signal; and
- an identification unit electrically connected to the first circuit path and the second circuit path, and configured to identify a first phase shift between the first detection signal and the third detection signal and identify a second phase shift between the second detection signal and the fourth detection signal.

20. The capacitive switch as claimed in claim 19, wherein the plurality of capacitive detection circuits is sequentially coupled to the first and second circuit paths by the multiplexer.

\* \* \* \* \*